US008294239B2

(12) United States Patent
Min

(10) Patent No.: US 8,294,239 B2
(45) Date of Patent: Oct. 23, 2012

(54) EFFECTIVE EFUSE STRUCTURE

(75) Inventor: Byoung W. Min, Hopewell Junction, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 772 days.

(21) Appl. No.: 12/237,834

(22) Filed: Sep. 25, 2008

(65) Prior Publication Data

US 2010/0072571 A1 Mar. 25, 2010

(51) Int. Cl.
*H01L 23/52* (2006.01)

(52) U.S. Cl. ................................ 257/529; 257/E23.149

(58) Field of Classification Search .................. 257/529, 257/E23.149; 438/601
See application file for complete search history.

(56) References Cited

U.S. PATENT DOCUMENTS

| | | | | |
|---|---|---|---|---|
| 4,016,476 | A * | 4/1977 | Morokawa et al. | 363/60 |
| 5,708,291 | A | 1/1998 | Bohr et al. | |
| 5,969,404 | A | 10/1999 | Bohr et al. | |
| 6,624,499 | B2 * | 9/2003 | Kothandaraman et al. | 257/529 |
| 7,129,138 | B1 * | 10/2006 | Furukawa et al. | 257/E23.147 |
| 7,436,044 | B2 * | 10/2008 | Khan et al. | 257/529 |
| 7,714,326 | B2 * | 5/2010 | Kim et al. | 327/525 |
| 7,777,297 | B2 * | 8/2010 | Yang et al. | 257/529 |
| 7,982,285 | B2 * | 7/2011 | Park et al. | 438/601 |
| 2007/0090486 | A1 * | 4/2007 | Otsuka et al. | 257/529 |
| 2008/0067600 | A1 * | 3/2008 | Hsu et al. | 257/360 |
| 2008/0157268 | A1 * | 7/2008 | Kim et al. | 257/529 |
| 2008/0277756 | A1 * | 11/2008 | Min et al. | 257/529 |
| 2009/0101989 | A1 * | 4/2009 | Chen et al. | 257/379 |

* cited by examiner

*Primary Examiner* — Matthew Landau
*Assistant Examiner* — Sun M Kim

(57) ABSTRACT

An electrically programmable fuse (eFuse) comprises a semiconductor layer, a silicide layer overlying the semiconductor layer, and first and second contact structures electrically coupled to the silicide layer. The first contact structure is configured to function as an anode and the second contact structure is configured to function as a cathode. The eFuse further comprises a back-gate structure disposed underneath the semiconductor layer in a back-gate structure region proximate the second contact structure, the back-gate structure region excluding a region proximate the first contact structure. Responsive to (i) a programming voltage potential supplied between the first and second contact structures and (ii) a voltage potential supplied to the back-gate structure, silicide of the silicide layer operates to migrate, with an enhanced migration, into the semiconductor layer from the cathode to the anode with an absence of silicide residue in at least the back-gate structure region of the semiconductor layer between the first and second contact structures.

23 Claims, 3 Drawing Sheets

EFFECTIVE EFUSE STRUCTURE

BACKGROUND

1. Field

This disclosure relates generally to an electronically programmable fuse (eFuse), and more specifically, to an improved eFuse structure and method of making the same.

2. Related Art

Electrically programmable fuses (eFuses) generally include a silicide overlying a polysilicon layer, further having a first contact positioned on one end of the silicide and a second contact disposed at a distance from the first contact on an opposite end of the silicide. One contact functions as the anode while the other contact functions as a cathode.

Programming of an eFuse is typically accomplished by forcing a large electrical current through the eFuse. This high current is intended to break the eFuse structure which results in an electrical open. In other words, during programming, it is desirable for the silicide to migrate from the cathode to the anode and thus create an electrical "open" in the silicide.

Furthermore, for conventional eFuse programming, the eFuse structure to be programmed is typically selected by a decoded address which is generated by a control circuit that is powered by a low voltage supply ($V_{DD}$). An eFuse programming command is created by additional logic circuitry which generates a program enable signal. The program enable signal is converted from the voltage level of the logic supply ($V_{DD}$) to the voltage level of the programming supply ($PV_{DD}$) by a level shifter. The program enable signal may be amplified by several driver stages. If an eFuse is selected by the control logic and a program enable signal is present, a current can pass through the selected eFuse for programming.

As such, eFuses have been implemented in integrated circuits as attractive passive devices to electrically repair failures within an integrated circuit product. However, if during programming of the eFuse, the silicide in the eFuse is not completely migrated to its anode from its cathode, then the eFuse is rendered non-functional.

In addition, as poly gates are scaled down to smaller and smaller dimensions, the actual poly media portion in an eFuse becomes smaller and smaller, causing silicide migration through the poly medium to become more and more difficult. In other words, as the gate poly height in an eFuse structure is scaled down, there is concern about full silicidation (FUSI), whereby full silicidation causes a malfunction of the eFuse. Furthermore, it is difficult to produce silicide migration when the medium (e.g., poly) is smaller than a critical dimension.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The embodiments of the present disclosure resolve problems in the art by utilizing a back gate bias under cathode in a novel efuse structure, as discussed herein. With the back gate bias, a silicide migration to anode is enhanced. In one embodiment, a back gate operation can be carried out with use of transistor characteristics. In addition, the introduction of the back gate in an efuse structure advantageously enables an effective eFuse silicide migration.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
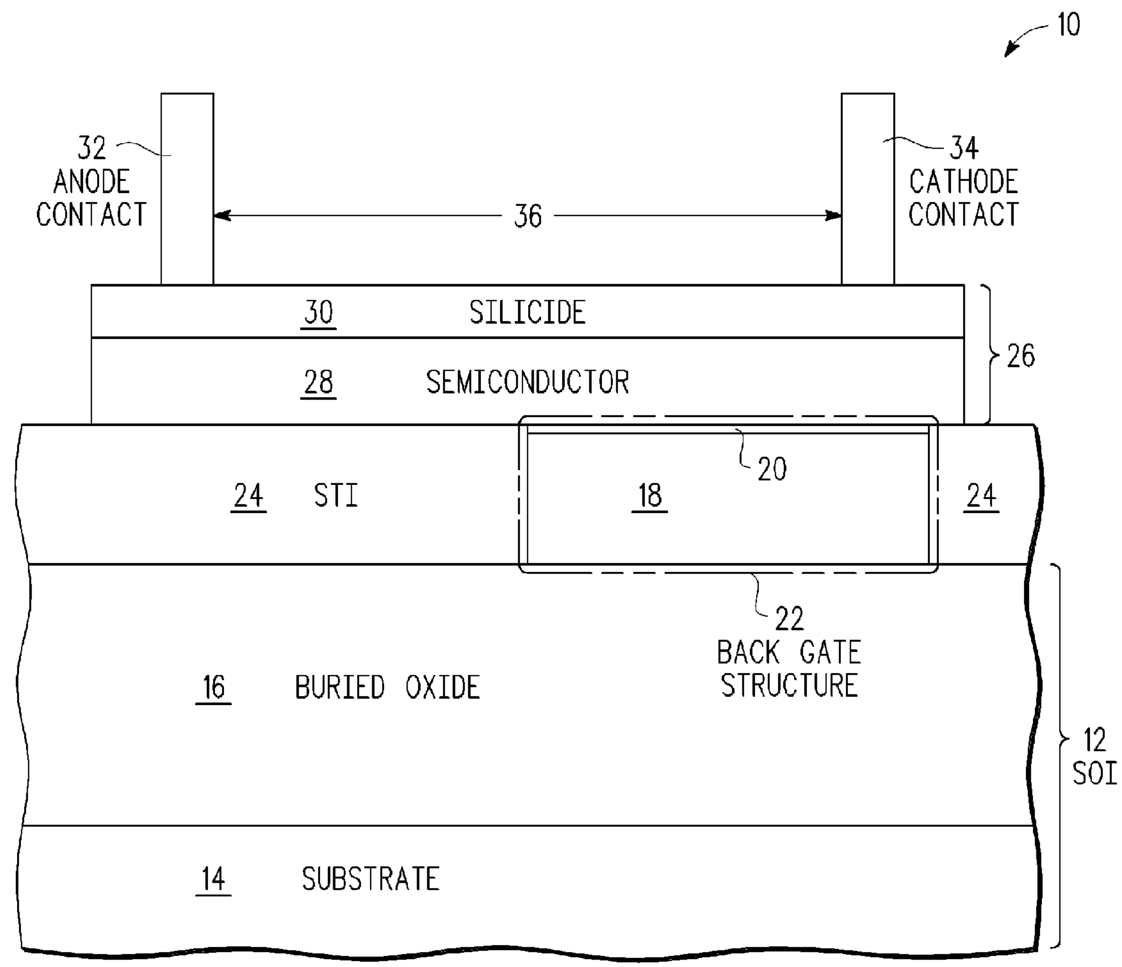
FIG. 1 is a cross-sectional view of an electrically programmable fuse structure featuring a back gate structure according to one embodiment of the present disclosure.

FIG. 1 is a cross-sectional view of an electrically programmable fuse structure 10 featuring a back gate structure according to one embodiment of the present disclosure. The electrically programmable fuse 10 includes, for example, an SOI substrate 12 comprising base substrate 14 having a buried oxide layer 16 overlying the substrate 14. A semiconductor layer 18 and a gate dielectric 20 overlying the semiconductor layer 18 are formed over the buried oxide layer 16. The semiconductor layer 18 and gate dielectric 20 comprise a back gate structure 22, to be discussed further herein. The semiconductor layer 18 and gate dielectric 20 are bounded by shallow trench isolation (STI) regions 24. The semiconductor layer 18 and gate dielectric 20 can comprise any suitable semiconductor and gate dielectric layer, respectively, chosen according to the particular requirements of a given eFuse implementation. For example, the gate dielectric 20 can comprise one or more of silicon oxide ($SiO_2$), aluminum oxide ($Al_2O_3$), hafnium oxide ($HfO_2$), hafnium silicate (HfSiO), or hafnium silicon oxynitride (HfSiON). In one embodiment, the gate dielectric 20 can comprise a thickness on the order of approximately 12-14 angstroms. In addition, the buried oxide layer 16 can comprise an oxide having a thickness on the order of approximately 1500 angstroms, and the shallow trench isolation 24 can comprise STI having a thickness on the order of approximately 700 angstroms.

With reference still to FIG. 1, an electrically programmable fuse 26 is formed overlying the back gate structure 22 and STI regions 24. In particular, the eFuse 26 includes a semiconductor layer 28 and a silicide layer 30 overlying the semiconductor layer 28. The thickness of eFuse 26 is a function of the technology being used in the fabrication of the eFuse. In one embodiment, the thickness of eFuse 26 is on the order of approximately 600 angstroms, wherein the silicide layer 30 comprises approximately on the order of twenty-five to fifty percent (25-50%) of the thickness of eFuse 26. The width of the eFuse 26 may be on the order of approximately 400 angstroms (or forty nanometers (40 nm)).

Electrically programmable fuse structure 10 further includes first and second contact structures as indicated by reference numerals 32 and 34. First and second contact structures (32,34) electrically couple to the silicide layer 30. In one embodiment, the first contact structure 32 functions as an anode and the second contact structure 34 functions as a cathode. In addition, first and second contact structures (32, 34) are spaced apart from one another along a length dimension of the eFuse 26 by a distance indicated by reference numeral 36. Furthermore, the contact structures 32 and 34 comprise any suitable contact material selected according to the particular requirements of a given eFuse structure implementation. For example, in one embodiment, contact structures 32 and 34 may comprise tungsten (W) having a height dimension on the order of 2000-3000 angstroms. In addition, the dimension 36 may be on the order of one-tenth micron (0.1 μm) or one hundred nanometers (100 nm). Other dimensions are also possible.

In one embodiment, the semiconductor layer 28 comprises an amorphous semiconductor layer. In another embodiment, the semiconductor layer 28 comprises a polysilicon layer. In addition, the silicide layer 30 can comprise any suitable silicide, for example, one selected from the group consisting of nickel silicide (NiSi), cobalt silicide (CoSi), and nickel platinum silicide (NiPtSi). Furthermore, the semiconductor layer 28 and silicide layer 30 can comprise any suitable semiconductor and silicide layer, respectively, chosen according to the particular requirements of a given eFuse implementation.

In addition, the dimension 36 within the eFuse structure 10 is representative of a first dimension of the silicide layer 30 between the first contact structure 32 and the second contact structure 34, the first dimension 36 extending along a principal direction of the silicide layer 30, and wherein the back-gate structure region 22 includes a first dimension extending from the second contact structure 34 towards the first contact structure 32 along the principal direction of the silicide layer 30 by a distance on the order of twenty-five to seventy-five percent (25-75%) of the first dimension 36 of the silicide layer. In yet another embodiment, the first dimension of the back-gate structure 22 is equal to approximately fifty percent (50%) of the first dimension 36 of the silicide layer 30.

Figure 2:
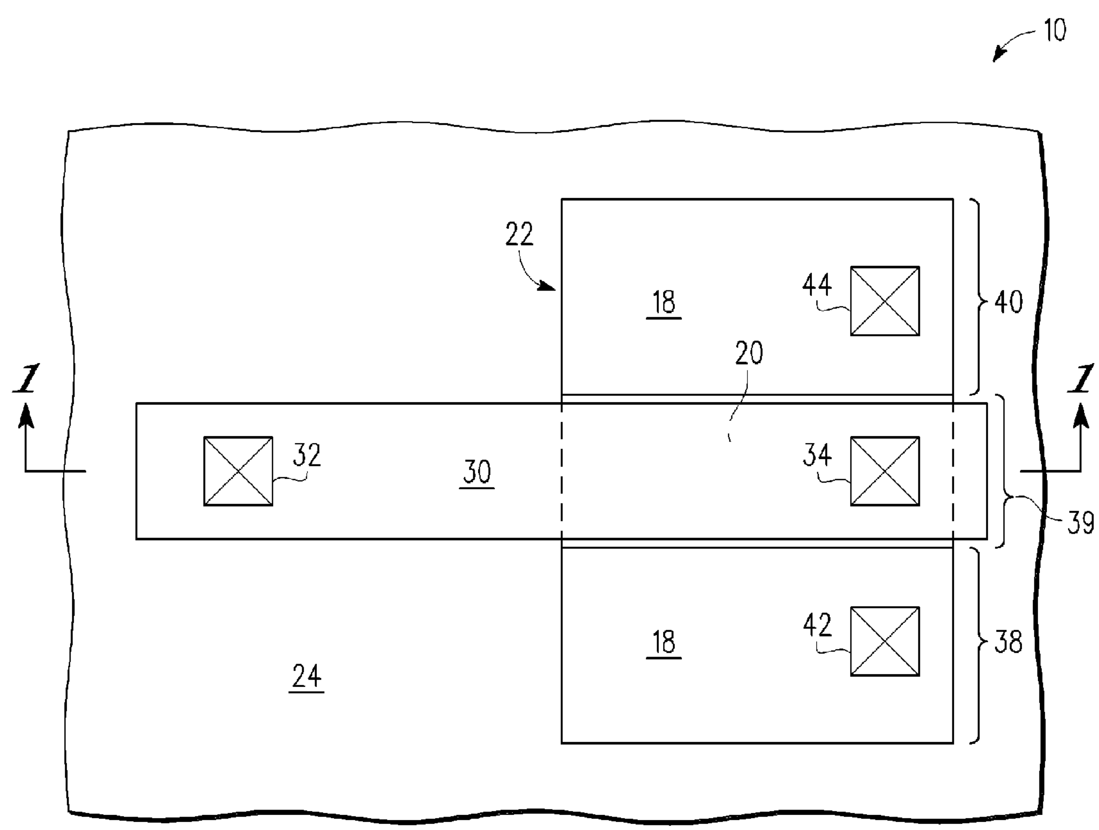
FIG. 2 is a top down view of the electrically programmable fuse structure of FIG. 1 according to one embodiment of the present disclosure.

Turning now to FIG. 2, FIG. 2 is a top down view of the electrically programmable fuse structure 10 of FIG. 1 according to one embodiment of the present disclosure. The cross-section of FIG. 1 is taken along line 1-1 of FIG. 2. In FIG. 2, the back-gate structure 22 includes a migration enhancement portion, generally indicated by reference numeral 39, thereof that is disposed underneath the semiconductor and silicide layers (28,30) of the eFuse 26 in a back-gate structure region proximate the second contact structure 34. The migration enhancement portion 39 is at least as wide as a width dimension of eFuse 26 in the back-gate structure region. Note that the back-gate structure region excludes a region proximate the first contact structure 32. The back-gate structure 22 is further characterized by first and second portions indicated by reference numerals 38 and 40, respectively, which do not directly underlying the eFuse 26. First portion 38 includes a contact structure 42 electrically coupled to the semiconductor layer 18 within the area of the first portion 38 of the back-gate structure 22. Second portion 40 includes a contact structure 44 electrically coupled to the semiconductor layer 18 within the area of the second portion 40 of the back-gate structure 22.

Contact structures 32, 34, 42 and 44 can comprise any suitable contact structure selected according to the requirements of a given eFuse structure implementation. In one embodiment, the contact structures comprise tungsten (W). Contact structures 32, 34, 42, and 44 represent a minimum number of contact structures for the eFuse structure 10. Additional contact structures can be provided according to the requirements of a given eFuse structure implementation.

Figure 3:
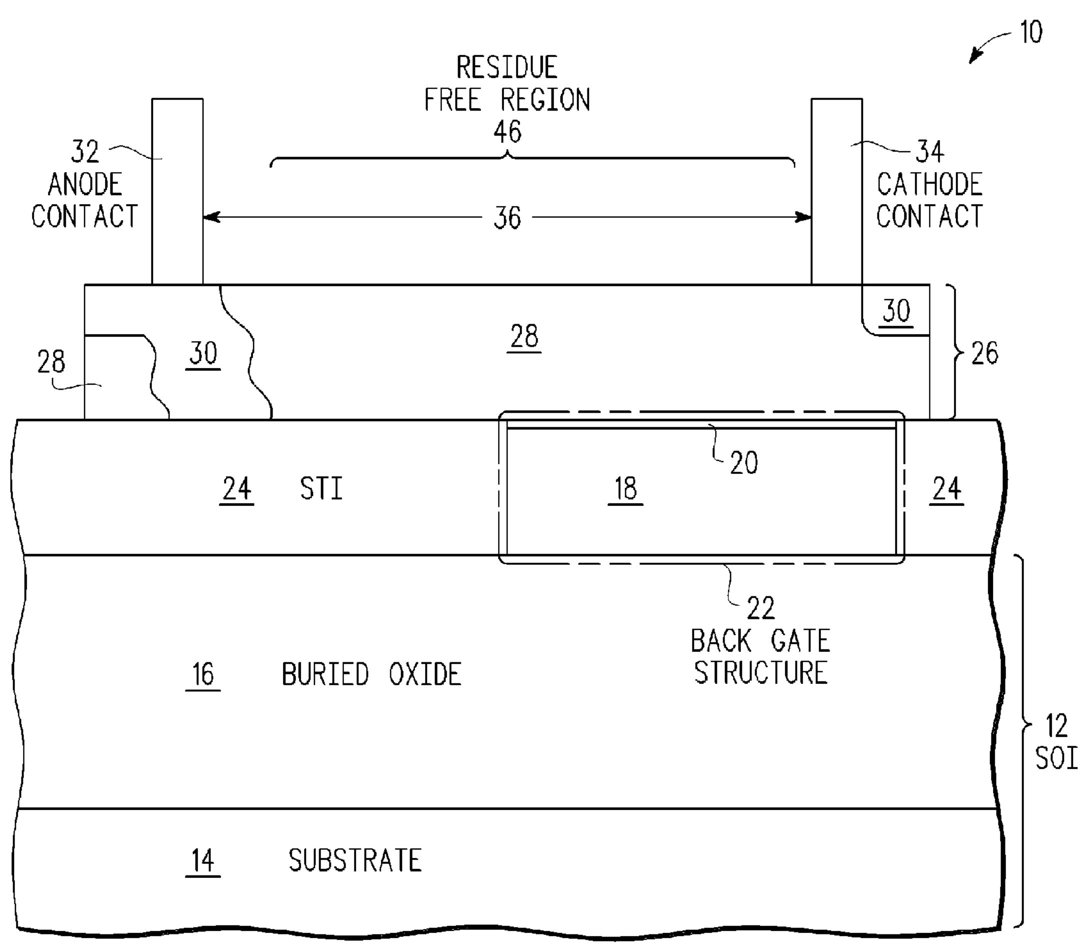
FIG. 3 is a cross-sectional view of an electrically programmable fuse structure featuring a back gate structure according to one embodiment of the present disclosure, wherein the eFuse has been programmed.

FIG. 3 is a cross-sectional view of an electrically programmable fuse structure 10 featuring a back gate structure according to one embodiment of the present disclosure, wherein the eFuse has been programmed. Upon a programming of the eFuse 26, as discussed herein, silicide 30 that originally occurs between the cathode contact structure 34 and the anode contact structure 32 migrates within the semiconductor layer 28 to a region of the anode contact structure 32. Subsequent to programming, a portion of the semiconductor layer 28 between the cathode contact structure 34 and the anode contact structure 32 is substantially free of silicide residue, thus rendering the corresponding region a residue free region, as indicated by reference numeral 46.

According to one embodiment, the eFuse structure 10 is configured wherein responsive to (i) a programming voltage potential supplied between the first and second contact structures 32 and 34, respectively, and (ii) a voltage potential supplied to the back-gate structure 22, for example, across contact structures 42 and 44, silicide of the silicide layer 30 operates to migrate, with an enhanced migration, into the semiconductor layer 28 from the cathode to the anode with an absence of silicide residue in at least the back-gate structure region of the semiconductor layer 28 between the first and second contact structures 32 and 34, respectively.

In another embodiment, the back-gate structure 22 of the eFuse structure 10 comprises a gate dielectric layer 20 overlying a conductor 18. In the corresponding embodiment, the eFuse structure 10 is configured wherein responsive to a programming voltage potential (i) supplied between the first and second contact structures 32 and 34, respectively, and (ii) supplied to the conductor, for example, across contact structures 42 and 44, silicide of the silicide layer 30 operates to migrate into the semiconductor layer 28 from the cathode to the anode with an absence of silicide residue in at least the back-gate structure region 22 of the semiconductor layer 18 between the first and second contact structures 32 and 34, respectively. In other words, providing the back gate structure with a voltage potential which of similar magnitude to that applied to the cathode advantageously renders or produces effective silicide depletion near the cathode.

In yet another embodiment, the back-gate structure 22 comprises gate dielectric layer 20 overlying at least a portion of a resistor 18. In the corresponding embodiment, the eFuse structure 10 is further configured wherein (i) responsive to (i)(a) a programming voltage potential supplied between the first and second contact structures 32 and 34, respectively, and (i)(b) a Joule-heating voltage potential ($V_{Joule\text{-}heating}$) supplied across the resistor via contact structures 42 and 44, silicide of the silicide layer 30 operates to migrate, with an accelerated migration in response to Joule-heating by the resistor, into the semiconductor layer 28 from the cathode to the anode with an absence of silicide residue in at least the back-gate structure region 22 of the semiconductor layer 28 between the first and second contact structures 32 and 34, respectively. In another embodiment, the resistor 18 comprises a doped semiconductor layer. In other words, the process of flowing a current from the first portion 38 of back gate structure 22 to the second portion 40 of back gate structure 22 advantageously accelerates silicide migration by Joule-heating near the cathode region of the eFuse structure 10.

According to another embodiment, the back-gate structure 22 comprises a portion of a CMOS transistor. In the corresponding embodiment, the eFuse structure 10 is further configured wherein the portion of the transistor includes a gate dielectric 20, a channel region 39, a source region 38, and a drain region 40, wherein the gate dielectric 20 overlies at least the channel region 39 between the source region 38 and the drain region 40. In addition, the eFuse structure 10 is further configured wherein (i) responsive to (i)(a) a programming voltage potential supplied between the first and second contact structures 32 and 34, respectively, and (i)(b) a transistor voltage potential $V_{DS}$ supplied across the drain and source regions (40,38), the semiconductor and silicide layers (28,30) collectively operate as a gate of the transistor for initiating silicide migration from the cathode to the anode with enhancement through self-heating of at least the channel region 39 of the transistor under bias, further wherein (ii) responsive to a given percentage of silicide migration to the anode (e.g., contact structure 32), the semiconductor and silicide layers (28,30) no longer collectively operate as the gate of the transistor and current from the drain region 40 to the source region 38 of the transistor automatically terminates. Furthermore, silicide of the silicide layer 30 operates to migrate, with an enhanced migration in response to the self-heating, into the semiconductor layer 28 from the cathode to the anode with an absence of silicide residue in at least the back-gate structure region 22 of the semiconductor layer 28 between the first and second contact structures 32 and 34, respectively. In other words, with portion 38 of the back gate structure acting as a source, portion 40 of the back gate structure acting as a drain, and the eFuse 26 acting as a gate, silicide migration advantageously starts with enhancement by self-heating under suitable transistor bias. As silicide migrates from the cathode region to the anode region, the eFuse 26 reaches a point in which the eFuse 26 no longer can act as a gate and thus current from the drain (region 40) to source (region 38) automatically shuts down.

By now it should be appreciated that there has been provided an electrically programmable fuse (eFuse) comprising: a semiconductor layer; a silicide layer overlying the semiconductor layer; a first contact structure electrically coupled to the silicide layer; a second contact structure electrically coupled to the silicide layer, wherein the first contact structure functions as an anode and the second contact structure functions as a cathode; and a back-gate structure disposed underneath the semiconductor layer in a back-gate structure region proximate the second contact structure, the back-gate structure region excluding a region proximate the first contact structure.

According to one embodiment, the eFuse is configured wherein responsive to (i) a programming voltage potential supplied between the first and second contact structures and (ii) a voltage potential supplied to the back-gate structure, silicide of the silicide layer operates to migrate, with an enhanced migration, into the semiconductor layer from the cathode to the anode with an absence of silicide residue in at least the back-gate structure region of the semiconductor layer between the first and second contact structures. In one embodiment, the semiconductor layer comprises an amorphous semiconductor layer. In another embodiment, the semiconductor layer comprises a polysilicon layer. In another embodiment, the silicide comprises one selected from the group consisting of nickel silicide (NiSi), cobalt silicide (CoSi), and nickel platinum silicide (NiPtSi). Other silcides are possible.

In a further embodiment, the back-gate structure of the eFuse structure comprises a gate dielectric layer overlying a conductor. In the corresponding embodiment, the eFuse structure is further configured wherein responsive to a programming voltage potential (i) supplied between the first and second contact structures and (ii) supplied to the conductor, silicide of the silicide layer operates to migrate into the semiconductor layer from the cathode to the anode with an absence of silicide residue in at least the back-gate structure region of the semiconductor layer between the first and second contact structures.

In yet another embodiment, the back-gate structure comprises a gate dielectric layer overlying at least a portion of a resistor. In the corresponding embodiment, the eFuse structure is further configured wherein (i) responsive to (i)(a) a programming voltage potential supplied between the first and second contact structures and (i)(b) a Joule-heating voltage potential (VJoule-heating) supplied across the resistor, silicide of the silicide layer operates to migrate, with an accelerated migration in response to Joule-heating by the resistor, into the semiconductor layer from the cathode to the anode with an absence of silicide residue in at least the back-gate structure region of the semiconductor layer between the first and second contact structures. In another embodiment, the resistor comprises a doped semiconductor layer.

According to another embodiment, the back-gate structure comprises a portion of a CMOS transistor. In the corresponding embodiment, the eFuse structure is further configured wherein the portion of the transistor includes a gate dielectric, a channel region, a source region, and a drain region, wherein the gate dielectric overlies at least the channel region between the source region and the drain region. In addition, the eFuse structure is further configured wherein (i) responsive to (i)(a) a programming voltage potential supplied between the first and second contact structures and (i)(b) a transistor voltage potential VDS supplied across the drain and source regions, the semiconductor and silicide layers collectively operate as a gate of the transistor for initiating silicide migration from the cathode to the anode with enhancement through self-heating of at least the channel region of the transistor under bias, further wherein (ii) responsive to a given percentage of silicide migration to the anode, the semiconductor and silicide layers no longer collectively operate as the gate of the transistor and current from the drain region to the source region of the transistor automatically terminates. Furthermore, silicide of the silicide layer operates to migrate, with an enhanced migration in response to the self-heating, into the semiconductor layer from the cathode to the anode with an absence of silicide residue in at least the back-gate structure region of the semiconductor layer between the first and second contact structures.

In another embodiment, the eFuse structure is configured wherein the silicide layer includes a first dimension between the first contact structure and the second contact structure, the first dimension extending along a principal direction of the silicide layer, and wherein the back-gate structure region includes a first dimension extending from the second contact structure towards the first contact structure along the principal direction of the silicide layer by a distance on the order of twenty-five to seventy-five percent (25-75%) of the first dimension of the silicide layer. In yet another embodiment, the first dimension of the back-gate structure is equal to approximately fifty percent (50%) of the first dimension of the silicide layer.

According to a further embodiment, an electrically programmable fuse (eFuse) comprises: a semiconductor layer; a silicide layer overlying the semiconductor layer; a first contact structure electrically coupled to the silicide layer; a second contact structure electrically coupled to the silicide layer, wherein the first contact structure functions as an anode and the second contact structure functions as a cathode; and a back-gate structure disposed underneath the semiconductor layer in a back-gate structure region proximate the second contact structure, the back-gate structure region excluding a region proximate the first contact structure, wherein the back-gate structure comprises one selected from the group consisting of (a) a gate dielectric layer overlying a conductor, (b) a gate dielectric layer overlying at least a portion of a resistor, and (c) a portion of a CMOS transistor, and further wherein responsive to (i) a programming voltage potential supplied between the first and second contact structures and (ii) a voltage potential supplied to the back-gate structure, silicide of the silicide layer operates to migrate, with an enhanced migration, into the semiconductor layer from the cathode to the anode with an absence of silicide residue in at least the back-gate structure region of the semiconductor layer between the first and second contact structures. The silicide layer includes a first dimension between the first contact structure and the second contact structure, the first dimension extending along a principal direction of the silicide layer, and wherein the back-gate structure region includes a first dimension extending from the second contact structure towards the first contact structure along the principal direction of the silicide layer by a distance on the order of twenty-five to seventy-five percent (25-75%) of the first dimension of the silicide layer. In another embodiment, the first dimension of the back-gate structure is equal to approximately fifty percent (50%) of the first dimension of the silicide layer.

According to yet another embodiment, a method for implementing an electrically programmable fuse (eFuse) comprises: forming a back-gate structure within an insulative layer; forming a semiconductor layer overlying the back-gate structure; forming a silicide layer overlying the semiconductor layer; forming a first contact structure electrically coupled to the silicide layer; and forming a second contact structure electrically coupled to the silicide layer, wherein the first contact structure functions as an anode and the second contact structure functions as a cathode, and wherein the back-gate structure is disposed underneath the semiconductor layer in a back-gate structure region proximate the second contact structure, the back-gate structure region excluding a region proximate the first contact structure.

Because the apparatus implementing the present invention is, for the most part, composed of semiconductor materials and processes known to those skilled in the art, certain details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the embodiments of the present disclosure can be applied to any integrated circuit products which may require repair for yield enhancement. The embodiments of the present disclosure may also be used as an electrical ID (identification). Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An electrically programmable fuse (eFuse) comprising:
- a semiconductor layer;
- a silicide layer overlying the semiconductor layer;
- a first contact structure electrically coupled to the silicide layer;
- a second contact structure electrically coupled to the silicide layer, wherein the first contact structure functions as an anode and the second contact structure functions as a cathode; and
- a back-gate structure disposed underneath the semiconductor layer in a back-gate structure region proximate the second contact structure, the back-gate structure region excluding a region proximate the first contact structure, and the back-gate structure is positioned at least partially directly underneath the second contact structure.

2. The apparatus of claim 1, wherein responsive to (i) a programming voltage potential supplied between the first and second contact structures and (ii) a voltage potential supplied to the back-gate structure, silicide of the silicide layer operates to migrate, with an enhanced migration, into the semiconductor layer from the cathode to the anode with an absence of silicide residue in at least the back-gate structure region of the semiconductor layer between the first and second contact structures.

3. The apparatus of claim 1, wherein the semiconductor layer comprises an amorphous semiconductor layer.

4. The apparatus of claim 1, wherein the semiconductor layer comprises a polysilicon layer.

5. The apparatus of claim 1, wherein the silicide comprises one selected from the group consisting of nickel silicide (NiSi), cobalt silicide (CoSi), and nickel platinum silicide (NiPtSi).

6. The apparatus of claim 1, wherein the back-gate structure comprises a gate dielectric layer overlying a conductor.

7. The apparatus of claim 6, further wherein responsive to a programming voltage potential (i) supplied between the first and second contact structures and (ii) supplied to the conductor, silicide of the silicide layer operates to migrate into the semiconductor layer from the cathode to the anode with an absence of silicide residue in at least the back-gate structure region of the semiconductor layer between the first and second contact structures.

8. The apparatus of claim 1, wherein the back-gate structure comprises a gate dielectric layer overlying at least a portion of a resistor.

9. The apparatus of claim 8, further wherein (i) responsive to (i)(a) a programming voltage potential supplied between the first and second contact structures and (i)(b) a Joule-heating voltage potential ($V_{Joule\text{-}heating}$) supplied across the resistor, silicide of the silicide layer operates to migrate, with an accelerated migration in response to Joule-heating by the resistor, into the semiconductor layer from the cathode to the anode with an absence of silicide residue in at least the back-gate structure region of the semiconductor layer between the first and second contact structures.

10. The apparatus of claim 9, wherein the resistor comprises a doped semiconductor layer.

11. The apparatus of claim 1, wherein the back-gate structure comprises a portion of a CMOS transistor.

12. The apparatus of claim 11, wherein the portion of the transistor includes a gate dielectric, a channel region, a source region, and a drain region, wherein the gate dielectric overlies at least the channel region between the source region and the drain region.

13. The apparatus of claim 12, further wherein (i) responsive to (i)(a) a programming voltage potential supplied between the first and second contact structures and (i)(b) a transistor voltage potential $V_{DS}$ supplied across the drain and source regions, the semiconductor and silicide layers collectively operate as a gate of the transistor for initiating silicide migration from the cathode to the anode with enhancement through self-heating of at least the channel region of the transistor under bias, further wherein (ii) responsive to a given percentage of silicide migration to the anode, the semiconductor and silicide layers no longer collectively operate as the gate of the transistor and current from the drain region to the source region of the transistor automatically terminates.

14. The apparatus of claim 13, further wherein silicide of the silicide layer operates to migrate, with an enhanced migration in response to the self-heating, into the semiconductor layer from the cathode to the anode with an absence of silicide residue in at least the back-gate structure region of the semiconductor layer between the first and second contact structures.

15. The apparatus of claim 1, wherein the silicide layer includes a first dimension between the first contact structure and the second contact structure, the first dimension extending along a principal direction of the silicide layer, and wherein the back-gate structure includes a first dimension extending from the second contact structure towards the first contact structure along the principal direction of the silicide layer by a distance on the order of twenty-five to seventy-five percent (25-75%) of the first dimension of the silicide layer.

16. The apparatus of claim 15, further wherein the first dimension of the back-gate structure is equal to approximately fifty percent (50%) of the first dimension of the silicide layer.

17. An electrically programmable fuse (eFuse) comprising:

a semiconductor layer;

a silicide layer overlying the semiconductor layer;

a first contact structure electrically coupled to the silicide layer;

a second contact structure electrically coupled to the silicide layer, wherein the first contact structure functions as an anode and the second contact structure functions as a cathode; and a back-gate structure disposed underneath the semiconductor layer in a back-gate structure region proximate the second contact structure, the back-gate structure region excluding a region proximate the first contact structure, and the back-gate structure is positioned at least partially directly underneath the second contact structure, wherein the back-gate structure comprises one selected from the group consisting of (a) a gate dielectric layer overlying a conductor, (b) a gate dielectric layer overlying at least a portion of a resistor, and (c) a portion of a CMOS transistor, and further wherein responsive to (i) a programming voltage potential supplied between the first and second contact structures and (ii) a voltage potential supplied to the back-gate structure, silicide of the silicide layer operates to migrate, with an enhanced migration, into the semiconductor layer from the cathode to the anode with an absence of silicide residue in at least the back-gate structure region of the semiconductor layer between the first and second contact structures.

18. The apparatus of claim 17, wherein the silicide layer includes a first dimension between the first contact structure and the second contact structure, the first dimension extending along a principal direction of the silicide layer, and wherein the back-gate structure region includes a first dimension extending from the second contact structure towards the first contact structure along the principal direction of the silicide layer by a distance on the order of twenty-five to seventy-five percent (25-75%) of the first dimension of the silicide layer.

19. The apparatus of claim 18, further wherein the first dimension of the back-gate structure is equal to approximately fifty percent (50%) of the first dimension of the silicide layer.

20. A method for implementing an electrically programmable fuse (eFuse) comprising:

forming a back-gate structure within an insulative layer;

forming a semiconductor layer overlying the back-gate structure;

forming a silicide layer overlying the semiconductor layer;

forming a first contact structure electrically coupled to the silicide layer; and forming a second contact structure electrically coupled to the silicide layer, wherein the first contact structure functions as an anode and the second contact structure functions as a cathode, and wherein the back-gate structure is disposed underneath the semiconductor layer in a back-gate structure region proximate the second contact structure, the back-gate structure region excluding a region proximate the first contact structure, and the back-gate structure is positioned at least partially directly underneath the second contact structure.

21. The apparatus of claim 1, wherein the back-gate structure includes a migration enhancement portion that is at least as wide as a width dimension of the semiconductor layer and the silicide layer in the back-gate structure region.

22. The apparatus of claim 1, wherein the back-gate structure further includes first and second portions which do not directly underly the semiconductor layer and the silicide layer, the first portion includes a third contact structure electrically coupled to the back-gate structure and the second portion includes a fourth contact structure electrically coupled to the back-gate structure.

23. The apparatus of claim 1, wherein the back-gate structure is disposed underneath and in contact with the semiconductor layer in the back-gate structure region.

* * * * *